(12) United States Patent
Takuma (10) Patent No.: US 11,394,379 B2
(45) Date of Patent: Jul. 19, 2022

(54) SWITCH DEVICE

(71) Applicant: ROHM Co., LTD., Kyoto (JP)

(72) Inventor: Toru Takuma, Kyoto (JP)

(73) Assignee: ROHM Co., LTD., Kyoto (JP)

( * ) Notice: Subject to any disclaimer, the term of this patent is extended or adjusted under 35 U.S.C. 154(b) by 0 days.

(21) Appl. No.: 17/085,221

(22) Filed: Oct. 30, 2020

(65) Prior Publication Data

US 2021/0143810 A1 May 13, 2021

(30) Foreign Application Priority Data

Nov. 1, 2019 (JP) .............................. JP2019-199617

(51) Int. Cl.
*H03K 17/082* (2006.01)
(52) U.S. Cl.
CPC ................................. *H03K 17/082* (2013.01)
(58) Field of Classification Search
None
See application file for complete search history.

(56) References Cited

U.S. PATENT DOCUMENTS

| | | | | |
|---|---|---|---|---|
| 2005/0269880 A1* | 12/2005 | Konishi | ................. | H02H 7/067 307/10.7 |
| 2006/0208568 A1* | 9/2006 | Kaita | ................... | F02N 11/087 307/9.1 |
| 2006/0244313 A1* | 11/2006 | Sullivan | ..................... | B60J 1/17 307/9.1 |
| 2007/0075584 A1* | 4/2007 | Moriya | .................... | H02J 1/14 307/9.1 |
| 2007/0096560 A1* | 5/2007 | Ishikawa | ............... | B60S 1/0818 307/9.1 |
| 2007/0241612 A1* | 10/2007 | Jacoby | ................. | B60S 1/0818 307/9.1 |

FOREIGN PATENT DOCUMENTS

JP  WO2017187785  12/2018

* cited by examiner

*Primary Examiner* — Menatoallah Youssef
*Assistant Examiner* — Khareem E Almo
(74) *Attorney, Agent, or Firm* — Chip Law Group (57) ABSTRACT

Disclosed herein is a switch device including a switch element coupled between a power supply terminal and an output terminal, and an output abnormality detection circuit that. When an output current flowing during a turn-on period of the switch element is smaller than a threshold value, the output abnormality detection circuit detects an occurrence of an output abnormal condition, and increases a turn-on resistance of the switch element to determine which of a load-open condition and a short-to-power-supply-voltage condition is occurring at the output terminal on a basis of an output voltage at the output terminal.

9 Claims, 7 Drawing Sheets

SWITCH DEVICE

CROSS REFERENCE TO RELATED APPLICATIONS

This application claims priority benefit of Japanese Patent Application No. JP 2019-199617 filed in the Japan Patent Office on Oct. 31, 2019. Each of the above-referenced applications is hereby incorporated herein by reference in its entirety.

BACKGROUND

The disclosure in the present specification relates to a switch device.

The inventor of the present application has been proposing a large number of new technologies for switch devices such as an in-vehicle intelligent power device (IPD) since before (see, for example, PCT Patent Publication No. WO2017/187785).

SUMMARY

For such related-art switch devices, however, there is room for further improvement in determining which of output abnormal conditions is occurring (particularly, distinguishing, during a switch-on period of a high-side switch large-scale integration (LSI), which of a load-open condition and a short-to-power-supply-voltage condition is occurring).

Accordingly, it is desirable to provide a switch device capable of properly determining which of output abnormal conditions is occurring.

A switch device according to an embodiment of the present disclosure includes a switch element coupled between a power supply terminal and an output terminal, and an output abnormality detection circuit that, when an output current flowing during a turn-on period of the switch element is smaller than a threshold value, detects an occurrence of an output abnormal condition, and increases a turn-on resistance of the switch element to determine which of a load-open condition and a short-to-power-supply-voltage condition is occurring at the output terminal on the basis of an output voltage at the output terminal (first configuration).

Here, in the switch device configured according to the first configuration, the output abnormality detection circuit preferably increases the turn-on resistance so as to cause the output voltage to coincide with a first voltage (second configuration).

Further, in the switch device configured according to the second configuration, the output abnormality detection circuit preferably compares the output voltage with a second voltage higher than the first voltage to determine which of the load-open condition and the short-to-power-supply-voltage condition is occurring at the output terminal (third configuration).

Further, in the switch device configured according to the third configuration, the output abnormality detection circuit preferably determines that the load-open condition is occurring at the output terminal when the output voltage is lower than the second voltage, and that the short-to-power-supply-voltage condition is occurring at the output terminal when the output voltage is higher than the second voltage (fourth configuration).

Further, in the switch device according to the fourth configuration, the output abnormality detection circuit preferably includes a first comparator that compares an output current detection signal according to the output current or a sense voltage according to the output current with a predetermined threshold voltage to generate an output abnormality detection signal, a second comparator that compares the output voltage with the first voltage to generate a turn-on resistance control signal, and a third comparator that compares the output voltage with the second voltage to generate a determination signal (fifth configuration).

Further, in the switch device configured according to the fifth configuration, the second comparator and the third comparator are preferably enable-controlled according to the output abnormality detection signal (sixth configuration).

Further, in the switch device according to the fifth configuration or the sixth configuration, the output abnormality detection circuit preferably further includes a first resistor coupled between the power supply terminal and an application node of the first voltage, a second resistor coupled between the power supply terminal and an application node of the second voltage, a first current source coupled between the application node of the first voltage and a constant electric potential node, and a second current source coupled between the application node of the second voltage and the constant electric potential node (seventh configuration).

Further, an electronic device according to another embodiment of the present disclosure includes the switch device configured according to any one of the above first to seventh configurations, and a load coupled to the switch device (eighth configuration).

Here, in the electronic device configured to according to the eighth configuration, the load is preferably a valve lamp, a relay coil, a solenoid, a light emitting diode, or a motor (ninth configuration).

Further, a vehicle according to a further embodiment of the present disclosure includes the electronic device according to the eighth configuration or the ninth configuration (tenth configuration).

According to the embodiments of the present disclosure, a switch device capable of properly determining which of output abnormal conditions is occurring can be provided.

DETAILED DESCRIPTION OF THE PREFERRED EMBODIMENT

<Semiconductor Integrated Circuit Device>

Figure 1:
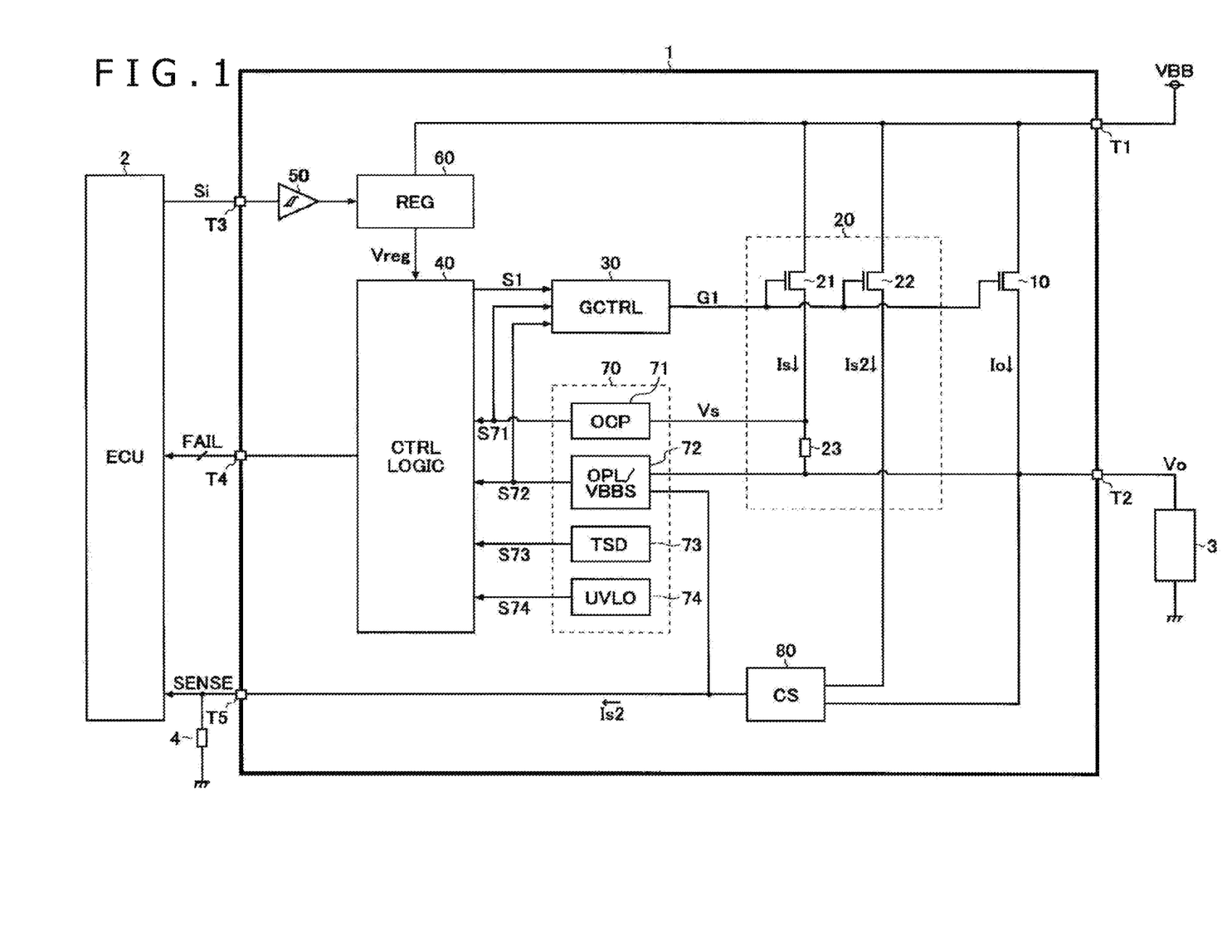
FIG. 1 is a diagram illustrating an entire configuration example of a semiconductor integrated circuit device.

FIG. 1 is a diagram illustrating an entire configuration example of a semiconductor integrated circuit device. A semiconductor integrated circuit device 1 in this configuration example is a high-side switch LSI (a kind of in-vehicle IPD) that conducts/cuts off between a load 3 and an application node of a power supply voltage VBB according to an instruction from an electronic control unit (ECU) 2.

Here, the semiconductor integrated circuit device 1 includes external terminals T1 to T5 as sections for establishing electric coupling to an outside of the device. The external terminal T1 is a power supply terminal (VBB pin) for receiving a supply of the power supply voltage VBB (for example, 12 V) from an unillustrated battery. The external terminal T2 is a load couple terminal or an output terminal (OUT pin) for being externally coupled to the load 3 (a valve lamp, a relay coil, a solenoid, a light emitting diode, a motor, or the like). The external terminal T3 is a signal input terminal (IN pin) for receiving an external input of an external control signal Si from the ECU 2. The external terminal T4 is a signal output terminal (FAIL pin) for externally outputting an output abnormality report signal FAIL to the ECU 2. The external terminal T5 is a signal output terminal (SENSE pin) for externally outputting an output current detection signal SENSE to the ECU 2. In addition, an external sense resistor 4 is coupled between the external terminal T5 and a ground node at the outside of the device.

Further, the semiconductor integrated circuit device 1 includes an n-type metal-oxide-semiconductor field-effect transistor (NMOSFET) 10, an output current monitoring section 20, a gate control section 30, a control logic section 40, a signal input section 50, an internal power supply section 60, an abnormality protection section 70, and an output current detection section 80, these sections being integrated in the semiconductor integrated circuit device 1.

The NMOSFET 10 is a high voltage tolerance power transistor (its voltage tolerance being, for example, 42 V) with its drain node coupled to the external terminal T1 and its source node coupled to the external terminal T2. The NMOSFET 10 coupled in this way functions as a switch element (high-side switch) for conducting/cutting off a current path extending from the application node of the power supply voltage VBB to the ground node via the load 3. In addition, the NMOSFET 10 is turned on when a gate drive signal G1 is at a high level and is turned off when the gate drive signal G1 is at a low level.

Further, for the NMOSFET 10, its elements may be designed such that its turn-on resistance Ron is equal to several tens of mΩ. In this regard, however, the lower the turn-on resistance Ron is, the more likely to flow an overcurrent is and the more likely to occur an abnormal heat generation is when a short-to-ground condition (an abnormal condition in which a short circuit to a ground node or a low electric potential node equivalent thereto is occurring) is occurring at the external terminal T2. Thus, the further the turn-on resistance Ron of the NMOSFET 10 is decreased, the higher the importance of each of an overcurrent protection circuit 71 and a temperature protection circuit 73, which will be described later, is.

The output current monitoring section 20 includes NMOSFETs 21 and 22 and a sense resistor 23 and generates a sense voltage Vs (corresponding to the sense signal) according to an output current Io flowing through the NMOSFET 10.

The NMOSFETs 21 and 22 are mirror transistors coupled in parallel to the NMOSFET 10 and generate sense currents Is and Is2 according to the output current Io. A ratio of the size of the NMOSFET 10 relative to the size of each of the NMOSFETs 21 and 22 is represented by m:1 (m>1). Thus, each of the sense currents Is and Is2 has a decreased magnitude equal to 1/m of the magnitude of the output current Io. In addition, just like the NMOSFET 10, the NMOSFETs 21 and 22 are turned on when the gate drive signal G1 is at the high level and are turned off when the gate drive signal G1 is at the low level.

The sense resistor 23 (its resistance value: Rs) is coupled between a source node of the NMOSFET 21 and the external terminal T2 and is a current-to-voltage conversion element for generating the sense voltage Vs according to the sense current Is (Vs=Is×Rs+Vo, Vo being an output voltage that appears at the external terminal T2).

The gate control section 30 generates the gate drive signal G1 resulting from enhancing the electric current ability of a gate control signal S1 and outputs the gate drive signal G1 to the gate node of the NMOSFET 10 (further to gate nodes of the NMOSFETs 21 and 22), to thereby perform turn-on/off control of the NMOSFET 10. Here, the gate control section 30 includes a function of controlling the NMOSFET 10 so as to cause the output current Io to be limited according to an overcurrent protection signal S71. Further, the gate control section 30 also includes a function of controlling the turn-on resistance Ron of the NMOSFET 10 (involving its drain-source voltage Vds) according to an output abnormality detection signal S72 (specifically, a turn-on resistance control signal S72b described later).

The control logic section 40 receives supply of an internal power supply voltage Vreg and generates the gate control signal S1. When the external control signal Si is, for example, at a high level (logical level when the NMOSFET 10 is turned on), the internal power supply voltage Vreg is supplied from the internal power supply section 60 to the control logic section 40, and thus, the control logic section 40 is in an operation state, thereby causing the gate control signal S1 to be at a high level (=Vreg). On the other hand, when the external control signal Si is at a low level (logical level when the NMOSFET 10 is turned off), the internal power supply voltage Vreg is not supplied from the internal power supply section 60 to the control logic section 40, and thus, the control logic section 40 is in a non-operation state, thereby causing the gate control signal S1 to be at a low level (=GND). Further, the control logic section 40 monitors various output signals of the abnormality protection section 70. Particularly, the control logic section 40 also includes a function of generating the output abnormality report signal FAIL according to the result of the monitoring of the output abnormality detection signal S72 (specifically, an output abnormality detection signal S72a and a determination signal S72c, which will be described later).

The signal input section 50 is a Schmitt trigger for receiving the input of the external control signal Si from the external terminal T3 and transmitting a resultant signal to the control logic section 40 and the internal power supply section 60. Here, the external control signal Si is set to, for example, a high level when the NMOSFET 10 is turned on and a low level when the NMOSFET 10 is turned off.

The internal power supply section 60 generates a predetermined internal power supply voltage Vreg from the power supply voltage VBB and supplies the internal power supply voltage Vreg to individual portions of the semiconductor integrated circuit device 1. Here, the operation state/non-operation state of the internal power supply section 60 is controlled according to the external control signal Si. More specifically, the internal power supply section 60 is in the operation state when the external control signal Si is at a high level and is in the non-operation state when the external control signal Si is at a low level.

The abnormality protection section 70 is a circuit block for detecting various abnormal conditions of the semiconductor integrated circuit device 1 and includes the overcurrent protection circuit 71, an output abnormality detection circuit 72, the temperature protection circuit 73, and a voltage lowering protection circuit 74.

The overcurrent protection circuit 71 generates an overcurrent protection signal S71 according to the result of monitoring of the sense voltage Vs (namely, monitoring as to whether or not an overcurrent abnormal condition of the output current Io is occurring). Here, the overcurrent protection signal S71 is set to, for example, a low level when the abnormal condition is not detected and a high level when the abnormal condition is detected.

The output abnormality detection circuit 72 monitors the output voltage Vo and the output current detection signal SENSE to detect whether or not a load-open condition or a short-to-power-supply-voltage condition is occurring at the output terminal T2. Here, the short-to-power-supply-voltage condition is an abnormal condition in which a short circuit to an application node of the power supply voltage VBB or a high electric potential node equivalent thereto is occurring. Further, the output abnormality detection circuit 72 generates the output abnormality detection signal S72 according to the result of the detection. Here, the output abnormality detection signal S72 includes the output abnormality detection signal S72a, the turn-on resistance control signal S72b, and the determination signal S72c, the details of these signals being described later. In addition, the output abnormality detection signal S72a is set to, for example, a low level when the abnormal condition is not detected and a high level when the abnormal condition is detected.

The temperature protection circuit 73 includes a temperature detection element (not illustrated) for detecting an abnormal heat generation condition in the semiconductor integrated circuit device 1 (particularly, in the vicinity of the NMOSFET 10) and generates a temperature protection signal S73 according to the result of the detection (namely, according to whether or not the abnormal heat generation condition is occurring). Here, the temperature protection signal S73 is set to, for example, a low level when the abnormal condition is not detected and a high level when the abnormal condition is detected.

The voltage lowering protection circuit 74 generates a voltage lowering protection signal S74 according to the result of monitoring of the power supply voltage VBB or the internal power supply voltage Vreg (namely, according to whether or not an abnormal voltage lowering condition is occurring). Here, the voltage lowering protection signal S74 is set to, for example, a low level when the abnormal condition is not detected and a high level when the abnormal condition is detected.

The output current detection section 80 generates the sense current Is2 (=Io/m) according to the output current Io by causing the source voltage of the NMOSFET 22 to coincide with the output voltage Vo using an unillustrated bias section, and outputs the sense current Is2 to the external terminal T5. Thus, the output current detection signal SENSE resulting from a current-to-voltage conversion of the sense current Is2 using the external sense resistor 4 (its resistance value: R4) is transmitted to the ECU 2. At this time, the output current detection signal SENSE is represented by Is2×R4. The larger the output current Io is, the higher the output current detection signal SENSE is, and the smaller the output current Io is, the lower the output current detection signal SENSE is. Here, in the case where an electric current value of the output current Io is to be read from the output current detection signal SENSE, it is sufficient if an analog-to-digital (A/D) conversion of the output current detection signal SENSE is implemented in the ECU 2.

<Gate Control Section>

Figure 2:
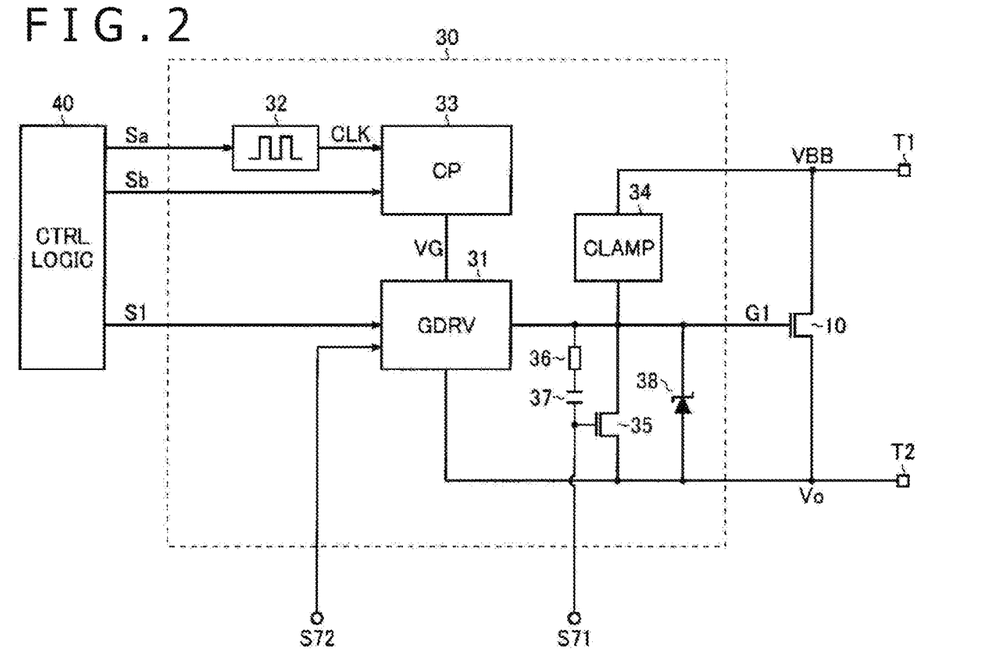
FIG. 2 is a diagram illustrating a configuration example of a gate control section.

FIG. 2 is a diagram illustrating a configuration example of the gate control section 30. The gate control section 30 of FIG. 2 includes a gate driver 31, an oscillator 32, a charge pump 33, a clamper 34, an NMOSFET 35, a resistor 36 (its resistance value: R36), a capacitor 37 (its capacitance value: C37), and a Zennor diode 38.

The gate driver 31 is coupled between an output node of the charge pump 33 (application node of a boosted voltage VG) and the external terminal T2 (application node of the output voltage Vo) and generates the gate drive signal G1 resulting from the enhancement of the electric current ability of the gate control signal S1. Here, the gate drive signal G1 is set to, for example, a high level (=VG) when the gate control signal S1 is at a high level, and a low level (=Vo) when the gate control signal S1 is at a low level.

Further, the gate driver 31 also includes a function of controlling the gate drive signal G1 so as to cause the turn-on resistance Ron of the NMOSFET 10 (involving the drain-source voltage Vds) to vary according to the output abnormality protection signal S72 (particularly, the turn-on resistance control signal S72b).

The oscillator 32 generates a clock signal CLK having a predetermined frequency and outputs the clock signal CLK to the charge pump 33. Here, the operation/non-operation of the oscillator 32 is controlled according to an enable signal Sa from the control logic section 40.

The charge pump 33 is an example of a voltage booster that generates a boosted voltage VG higher than the power supply voltage VBB by driving a flying capacitor using the clock signal CLK and supplies the boosted voltage VG to the gate driver 31. Here, the operation/non-operation of the charge pump 33 is controlled according to an enable signal Sb from the control logic section 40.

The clamper 34 is coupled between the external terminal T1 (application node of the power supply voltage VBB) and the gate node of the NMOSFET 10. In an application in which a load 3 having inductivity is coupled to the external terminal T2, when the NMOSFET 10 is switched from its on-state to its off-state, the output voltage Vo may be caused to fall to a negative voltage (<GND) by a back electromotive force of the load 3. For this reason, the clamper 34 (what is called an active clamp circuit) is provided for absorbing the energy of the back electromotive force.

A drain node of the NMOSFET 35 is coupled to the gate node of the NMOSFET 10. A source node of the NMOSFET 35 is coupled to the external terminal T2. A gate node of the NMOSFET 35 is coupled to an application node of the overcurrent protection signal S71. Further, the resistor 36 and the capacitor 37 are coupled in series between the drain node and the gate node of the NMOSFET 35.

A cathode of the Zennor diode 38 is coupled to the gate node of the NMOSFET 10. An anode of the Zennor diode 38 is coupled to the source node of the NMOSFET 10. The Zennor diode 38 coupled in this way functions as a clamp element that limits a gate-source voltage (=VG−Vo) of the NMOSFET 10 to a predetermined value or less.

In the gate control section 30 in the present configuration example, when the overcurrent protection signal S71 is set to a high level, the gate drive signal G1 is caused to fall with a predetermined time constant τ (=R36×C37) from a stationary state high level (=VG). As a result, the conductivity of the NMOSFET 10 is gradually decreased, and thus, a limitation applied to the output current Io is gradually increased. On the other hand, when the overcurrent protection signal S71 is set to a low level, the gate drive signal G1 is caused to rise with the predetermined time constant τ. As a result, the conductivity of the NMOSFET 10 is gradually increased, and thus, the limitation applied to the output current Io is gradually decreased.

In this way, the gate control section 30 in the present configuration example includes the function of controlling the gate drive signal G1 so as to cause the output current Io to be limited according to the overcurrent protection signal S71.

<Output Current Detection Section>

Figure 3:
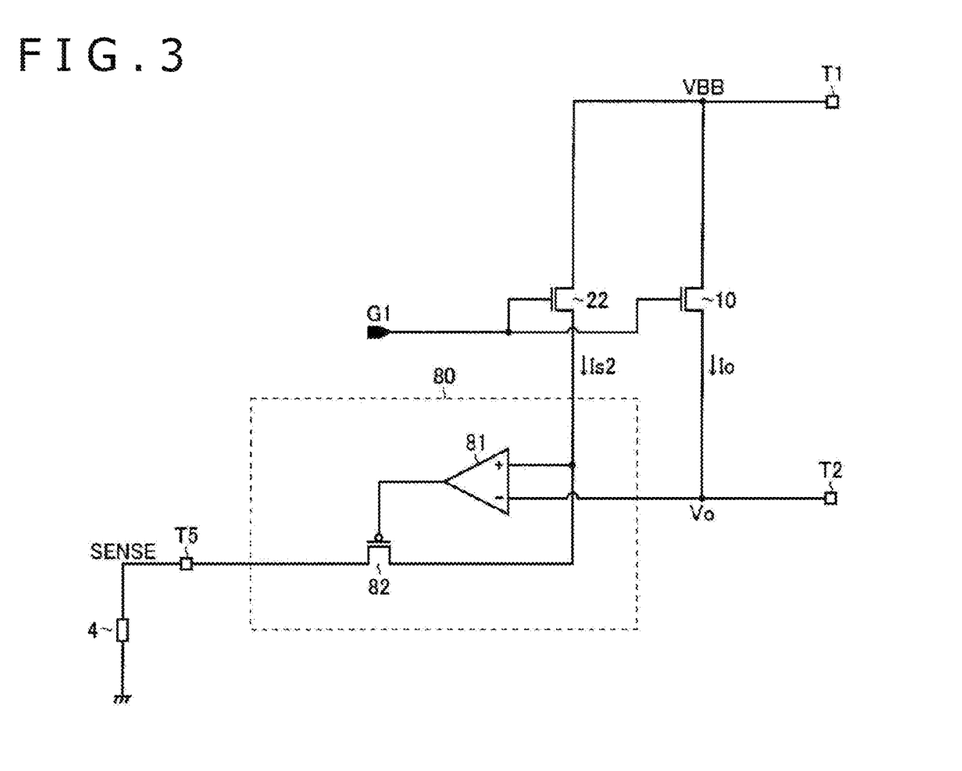
FIG. 3 is a diagram illustrating a configuration example of an output current detection section.

FIG. 3 is a diagram illustrating a configuration example of the output current detection section 80. The output current detection section 80 in this configuration example includes an amplifier 81 and a p-type MOSFET (PMOSFET) 82.

An inversion input node (−) of the amplifier 81 is coupled to the source node of the NMOSFET 10 (further to the external terminal T2). A non-inversion input node (+) of the amplifier 81 and a source node of the PMOSFET 82 are coupled to the source node of the NMOSFET 22. An output node of the amplifier 81 is coupled to a gate node of the PMOSFET 82. A drain node of the PMOSFET 82 is coupled to the external sense resistor 4 via the external terminal T5.

The amplifier 81 and the PMOSFET 82 coupled in this way function as a bias section that causes the source voltage of the NMOSFET 22 to coincide with the output voltage Vo. Thus, the output current detection section 80 is capable of accurately generating the sense current Is2 (=Io/m) according to the output current Io.

<Further Study Regarding Output Abnormal Conditions>

Figure 4:
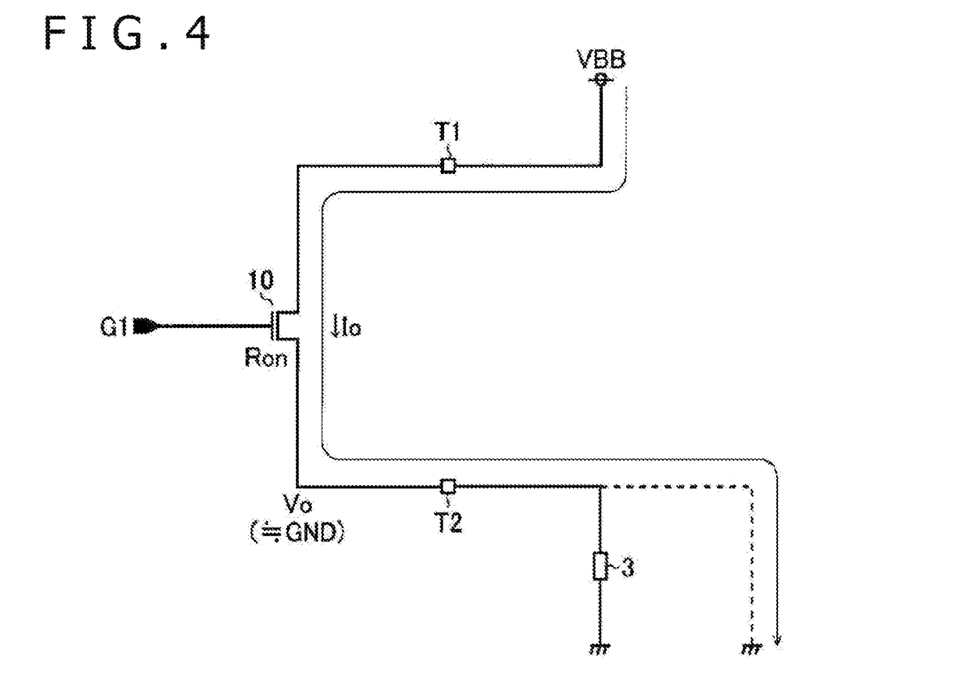
FIG. 4 is a diagram that describes a short-to-ground condition during a switch-on period.
Figure 5:
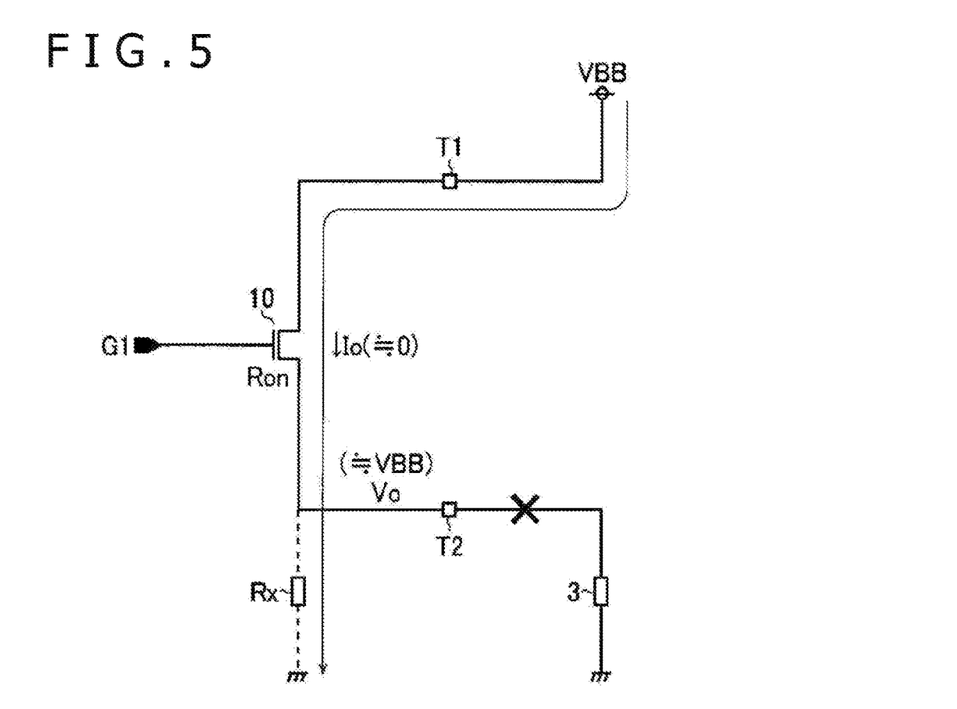
FIG. 5 is a diagram that describes a load-open condition during a switch-on period.
Figure 6:
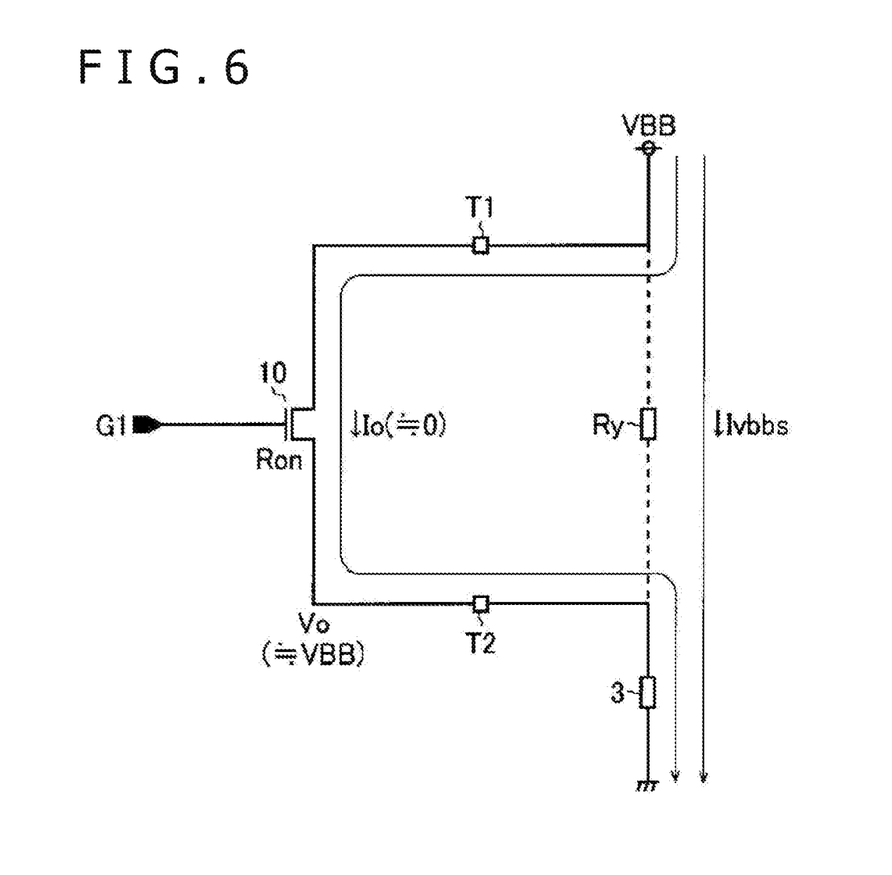
FIG. 6 is a diagram that describes a short-to-power-supply-voltage condition during a switch-on period.

FIGS. 4, 5, and 6 are diagrams that respectively describe a short-to-ground condition, a load-open condition, and a short-to-power-supply-voltage condition, during a switch-on period (turn-on period of the NMOSFET 10).

When the short-to-ground condition occurs at the output terminal T2 during the turn-on period of the NMOSFET 10, as illustrated in FIG. 4, the output voltage Vo becomes substantially equal to the ground electric potential GND, and an extremely large amount of the output current Io flows through the NMOSFET 10. That is, the output current Io is brought to an overcurrent state. Thus, satisfaction of conditions represented by Vo≈GND and S71=H (logical level when the overcurrent is detected) makes it possible to determine that the short-to-ground condition is occurring at the output terminal T2.

On the other hand, when the load-open condition occurs at the output terminal T2 during the turn-on period of the NMOSFET 10, as illustrated in FIG. 5, a current path from the NMOSFET 10 to the load 3 is cut off. Thus, only a slight amount of the output current Io flows through the NMOSFET 10. At this time, the slight amount of output current Io is determined by a resistance element Rx (>>Ron) of internal circuits coupled to the source node of the NMOSFET 10, and is represented by VBB/(Ron+Rx). As a result, the output voltage Vo (=VBB−Ron×Io) becomes substantially equal to the power supply voltage VBB.

Further, when the short-to-power-supply-voltage condition occurs at the output terminal T2 during the turn-on period of the NMOSFET 10, as illustrated in FIG. 6, a short-circuit path directly coupled between an application node of the power supply voltage VBB and the load 3 is formed. At this time, a resistance element Ry of the short-circuit path is significantly small (Ry=several mΩ to several tens of mΩ). Thus, most of a current flowing from the application node of the power supply voltage VBB to the load 3 flows through the above short-circuit path as a short-to-power-supply-voltage current Ivbbs, and thus, almost no output current Io flows through the NMOSFET 10. As a result, the output voltage Vo (=VBB−Ry×Ivbbs) becomes substantially equal to the power supply voltage VBB.

As described above, when the load-open condition or the short-to-power-supply-voltage condition is occurring at the output terminal T2 during the turn-on period of the NMOSFET 10, in both cases, the output voltage Vo becomes substantially equal to the power supply voltage VBB (namely, Vo≈VBB). For this reason, simple monitoring of the output voltage Vo does not make it possible to determine which of the load-open condition and the short-to-power-supply-voltage condition the abnormal condition occurring at the external terminal T2 is.

In view of the result of the above further study, in the following, the output abnormality detection circuit 72 is proposed which detects an output abnormal condition during the turn-on period of the NMOSFET 10 and is capable of determining which of the load-open condition and the short-to-power-supply-voltage condition the output abnormal condition is.

<Output Abnormality Detection Circuit>

Figure 7:
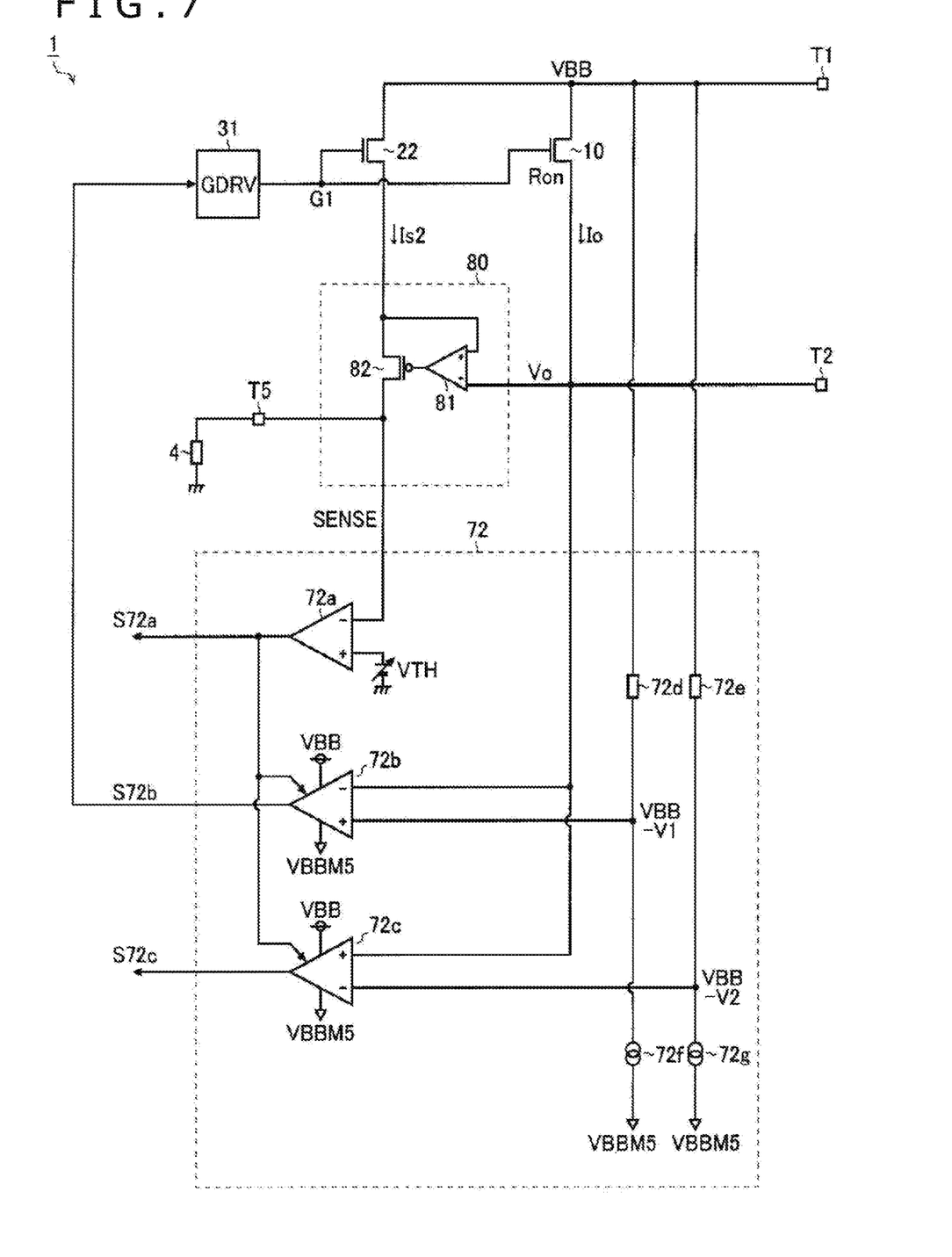
FIG. 7 is a diagram illustrating a configuration example of an output abnormality detection circuit.

FIG. 7 is a diagram illustrating a configuration example of the output abnormality detection circuit 72. The output abnormality detection circuit 72 in this configuration example includes comparators 72a to 72c, resistors 72d and 72e, and current sources 72f and 72g. Note that already-described components will be denoted by reference signs similar to those of the components, and thereby, duplicate descriptions thereof will be omitted.

The comparator 72a (corresponding to the first comparator) compares the output current detection signal SENSE that is input to its inversion input node (−) with a threshold voltage VTH that is input to its non-inversion input node (+) to generate the output abnormality detection signal S72a. The output abnormality detection signal S72a is set to a low level (logical level when the output abnormality is not detected) when a condition represented by SENSE>VTH is satisfied, and a high level (logical level when the output abnormality is detected) when a condition represented by SENSE<VTH is satisfied.

Specifically, when the load-open condition or the short-to-power-supply-voltage condition is occurring at the external terminal T2, almost no output current Io flows through the NMOSFET 10 (see FIG. 5 or FIG. 6 described above). Thus, the condition represented by SENSE<VTH is satisfied, and the output abnormality detection signal S72a is set to a high level (S72a=H). In this regard, however, merely monitoring the output abnormality detection signal S72a does not make it possible to distinguish which of the load-open condition and the short-to-power-supply-voltage condition is occurring.

Here, the threshold value VTH may be a fixed value or a variable value. In the case where the threshold value VTH is a variable value, for example, an external terminal is preferably prepared, to which an appropriately predetermined analog voltage is externally input as the threshold voltage VTH.

Further, FIG. 7 illustrates an example in which the output current detection signal SENSE is input to the comparator 72a, but the sense voltage Vs may be input thereto instead of the output current detection signal SENSE.

The comparator 72b (corresponding to the second comparator) operates upon receipt of the application of the power supply voltage VBB and a reference voltage VBBM5 (=VBB−5 V), and compares the output voltage Vo that is input to the inversion input node (−) with a first voltage VBB−V1 that is input to the non-inversion input node (+) to generate the turn-on resistance control signal S72b. The turn-on resistance control signal S72b is set to a low level (logical level when the turn-on resistance Ron is increased) when a condition represented by Vo>VBB−V1 is satisfied, and to a high level (logical level when the turn-on resistance Ron is not increased) when a condition represented by Vo<VBB−V1 is satisfied.

Further, the comparator 72b is enable-controlled according to the output abnormality detection signal S72a. More specifically, the comparator 72b is in a disabled state (non-operation state) when the output abnormality detection signal S72a is at a low level (S72a=L), and is in an enabled state (operation state) when the output abnormality detection signal S72a is at a high level (S72a=H).

Here, the gate driver 31 controls the gate drive signal G1 so as to cause the turn-on resistance Ron of the NMOSFET 10 (involving the drain-source voltage Vds) to vary according to the turn-on resistance control signal S72b.

Figure 8:
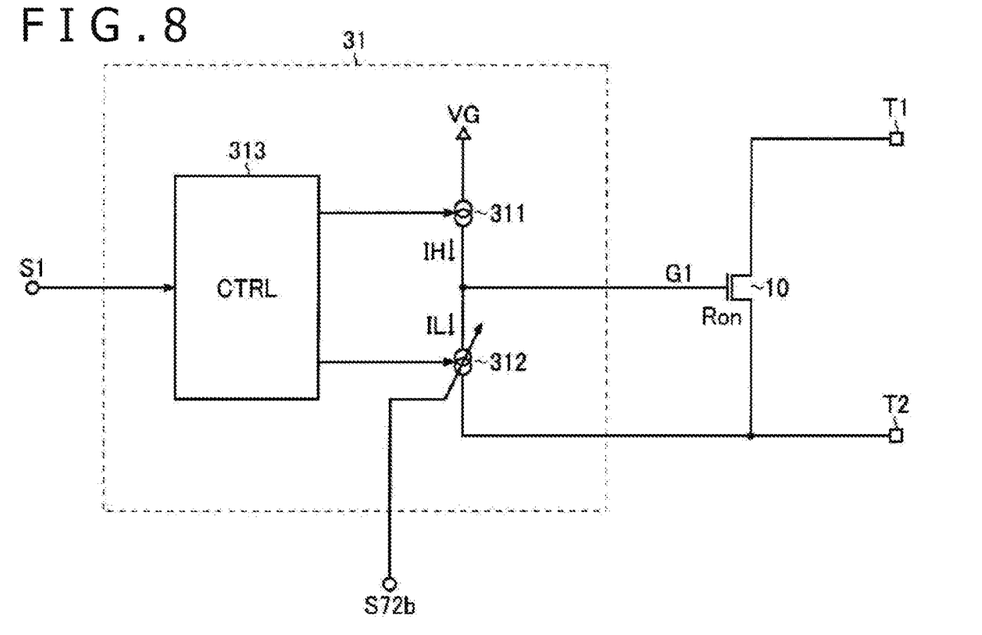
FIG. 8 is a diagram illustrating a configuration example of a gate driver.

FIG. 8 is a diagram illustrating a configuration example of the gate driver 31. The gate driver 31 in this configuration example includes a source-current source 311 and a sink-current source 312 that form an output stage of the gate driver 31, and a controller 313 that controls these current sources.

The source-current source 311 is coupled between an application node of the booted voltage VG and an application node of the gate drive signal G1. When the gate drive signal G1 is set to a high level (=VG), the source-current source 311 is turned on to cause a source current IH (upper-side gate drive current) to flow into the application node of the gate drive signal G1.

The sink-current source 312 is coupled between the application node of the gate drive signal G1 and the external terminal T2 (application node of the output voltage Vo). When the gate drive signal G1 is set to a low level (=Vo), the sink-current source 312 is turned on to draw a sink current IL (lower-side gate drive current) from the application node of the gate drive signal G1.

The controller 313 performs control of turning on/off each of the source current IH and the sink current IL by controlling the source-current source 311 and the sink-current source 312 according to the gate control signal S1. For example, when the gate control signal S1 is at a high level, the controller 313 sets the gate drive signal G1 to a high level (=VG) by turning on the source current IH and turning off the sink current IL. On the other hand, when the gate control signal S1 is at a low level, the controller 313 sets the gate drive signal G1 to a low level (=Vo) by turning off the source current IH and turning on the sink current IL.

Moreover, the sink current IL is turned on/off according to the turn-on resistance control signal S72b. More specifically, when the turn-on resistance control signal S72b is at a high level (S72b=H), the sink current IL is turned on even during the turn-on period of the NMOSFET 10 (which normally is a period during which the sink current IL is to be turned off). As a result, the gate drive signal G1 is decreased from the high level (=VG), and thus, the turn-on resistance Ron of the NMOSFET 10 is increased from its normal value. On the other hand, when the turn-on resistance control signal S72b is at a low level (S72b=L), the sink current IL is turned off, and thus, the turn-on resistance Ron is returned to its normal value.

As described above, when the comparator 72b is in the enabled state (S72a=H), the turn-on/off control of the sink current IL according to the turn-on resistance control signal S72b is performed. As a result, during the turn-on period of the NMOSFET 10, the turn-on resistance Ron of the NMOSFET 10 is controlled so as to cause the output voltage Vo to coincide with the first voltage VBB−V1.

Returning to FIG. 7, the detail description of the configuration and operation of the output abnormality detection circuit 72 will be continued.

The comparator 72c (corresponding to the third comparator) operates upon receipt of the application of the power supply voltage VBB and the reference voltage VBBM5 (=VBB−5 V), and compares the output voltage Vo that is input to the non-inversion input node (+) with a second voltage VBB−V2 (>VBB−V1) that is input to the inversion input node (−) to generate the determination signal S72c. The determination signal S72c is set to a low level (logical level when the load-open condition is occurring) when a condition represented by Vo<VBB−V2 is satisfied, and to a high level (logical level when the short-to-power-supply-voltage condition is occurring) when a condition represented by Vo>VBB−V2 is satisfied.

Further, the comparator 72c is enable-controlled according to the output abnormality detection signal S72a, just like the above-described comparator 72b. More specifically, the comparator 72c is in a disabled state (non-operation state) when the output abnormality detection signal S72a is at a low level (S72a=L), and is in an enabled state (operation state) when the output abnormality detection signal S72a is at a high level (S72a=H).

The resistor 72d (corresponding to the first resistor) is coupled between the external terminal T1 and an application node of the first voltage VBB−V1. The current source 72f (corresponding to the first current source) is coupled between the application node of the first voltage VBB−V1 and a node of a constant electric potential (=VBBM5). The resistor 72d (its resistance value: Rd) and the current source 72f (its current value: If), coupled in such a way as described above, generate, at a node therebetween, the first voltage VBB−V1, which is lower than the power supply voltage VBB by a predetermined voltage V1 (=Rd×If).

The resistor 72e (corresponding to the second resistor) is coupled between the external terminal T1 and an application node of the second voltage VBB−V2. The current source 72g (corresponding to the second current source) is coupled between the application node of the second voltage VBB−V2 and the node of the constant electric potential (=VBBM5). The resistor 72e (its resistance value: Re) and the current source 72g (its current value: Ig), coupled in such a away as described above, generate, at a node therebetween, the second voltage VBB−V2, which is lower than the power supply voltage VBB by a predetermined voltage V2 (=Re×Ig, V2<V1).

Note that FIG. 7 illustrates an example in which the first current source 72f and the second current source 72g constantly operate, but a configuration may be employed in which, just like the comparators 72b and 72c, the first current source 72f and the second current source 72g are enable-controlled according to the output abnormality detection signal S72a. In this case, the first current source 72f and the second current source 72g each may be in a disabled state (non-operation state) when the output abnormality detection signal S72a is at a low level (S72a=L), and be in an enabled state (operation state) when the output abnormality detection signal S72a is at a high level (S72a=H).

The output abnormality detection circuit 72 in the present configuration example makes it possible to, when the output current Io flowing during the turn-on period of the NMOSFET 10 is smaller than a threshold value (SENSE<VTH), detect an occurrence of an output abnormal condition, and increase the turn-on resistance Ron of the NMOSFET 10 to determine which of the load-open condition and the short-to-power-supply-voltage condition is occurring at the external terminal T2 on the basis of the output voltage Vo.

More specifically, the output abnormality detection circuit 72 compares the output voltage Vo with the second voltage VBB−V2, and is capable of determining that the load-open condition is occurring when a condition represented by Vo<VBB−V2 is satisfied, and of determining that the short-to-power-supply-voltage condition is occurring when a condition represented by Vo>VBB−V2 is satisfied.

In the following, an output abnormality detection operation (a determination operation for each of the load-open condition and the short-to-power-supply-voltage condition) will be described in detail referring to FIGS. 9 and 10.

<Output Abnormality Detection Operation (Determination Operation for Load-Open Condition and Short-to-Power-Supply-Voltage Condition)>

Figure 9:
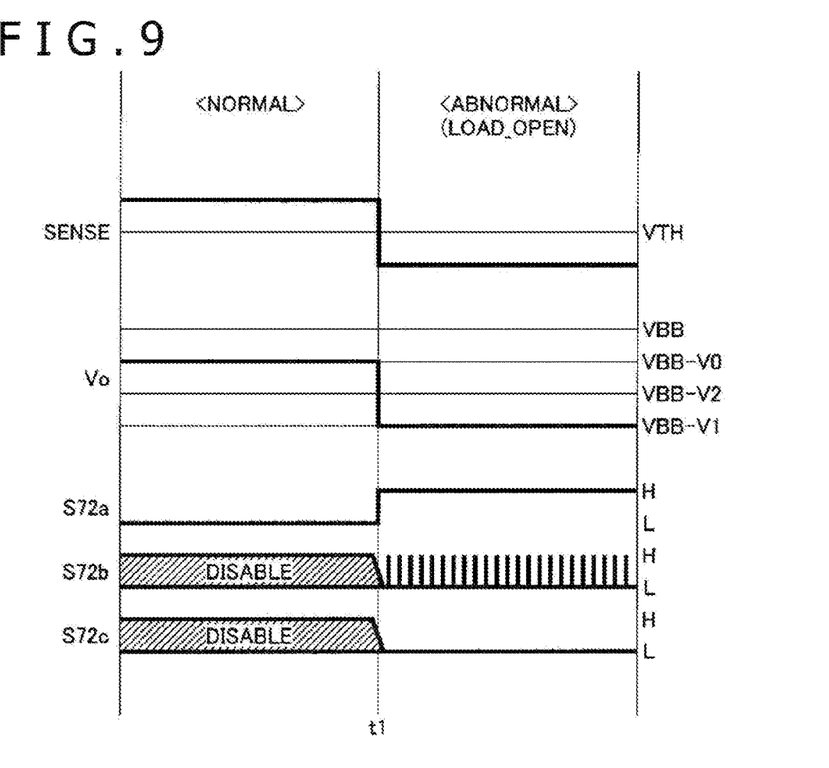
FIG. 9 is a diagram illustrating an example of a load-open condition detection operation.

FIG. 9 is a diagram illustrating an example of a load-open condition detection operation. FIG. 9 depicts, in order from its top side, the output current detection signal SENSE, the output voltage Vo, the output abnormality detection signal S72a, the turn-on resistance control signal S72b, and the determination signal S72c.

Before time t1, the load-open condition is not occurring at the external terminal T2, and the output current Io is appropriately flowing through the fully turned-on NMOSFET 10. Thus, the output current detection signal SENSE is higher than the threshold voltage VTH. Further, the output voltage Vo is equal to a voltage VBB−V0, which is lower than the power supply voltage VBB by a drain-source voltage V0 of the NMOSFET 10 (V0=Io×Ron0, Ron0 being a turn-on resistance of the fully turned-on NMOSFET 10).

Further, before the time t1, a condition represented by SENSE>VTH is satisfied, and thus, a condition represented by S72a=L (logical level when the output abnormality is not detected) is satisfied. Thus, each of the turn-on resistance control signal S72b and the determination signal S72c is in a disabled state (for example, a high impedance state).

Upon occurrence of a load-open condition at the external terminal T2 at the time t1, a situation in which almost no output current Io flows through the NMOSFET 10 (see FIG. 5 described above) arises. Thus, the output current detection signal SENSE becomes lower than the threshold voltage VTH.

At this time, a condition represented by S72a=H (logical level when the output abnormality is detected) is satisfied, and thus, the comparator 72b is brought to the enabled state. Accordingly, after the time t1, the turn-on resistance Ron of the NMOSFET 10 (involving the drain-source voltage Vds) is controlled according to the turn-on resistance control signal S72b.

Note that in the case where the load-open condition is occurring at the external terminal T2, the output voltage Vo (=VBB−Ron×Io) can be changed to any target voltage by controlling the turn-on resistance Ron of the NMOSFET 10. For example, in FIG. 9, the output voltage Vo is adjusted so as to coincide with the first voltage VBB−V1 (<VBB−V0) by increasing the turn-on resistance Ron of the NMOSFET 10 from the turn-on resistance Ron0, which is the turn-on resistance of the fully turned-on NMOSFET 10.

Further, upon satisfaction of the condition represented by S72a=H (logical level when the output abnormality is detected), the comparator 72c is also brought to the enabled state. Thus, after the time t1, the determination signal S72c according to the result of the comparison of the output voltage Vo with the second voltage VBB−V2 is output. According to FIG. 9, a condition represented by Vo (=VBB−V1)<VBB−V2 is satisfied, and thus, the determination signal S72c is set to a low level.

In this way, when conditions represented by S72a=H and S72c=L are satisfied, a determination that the load-open condition is occurring at the external terminal T2 can be made.

Figure 10:
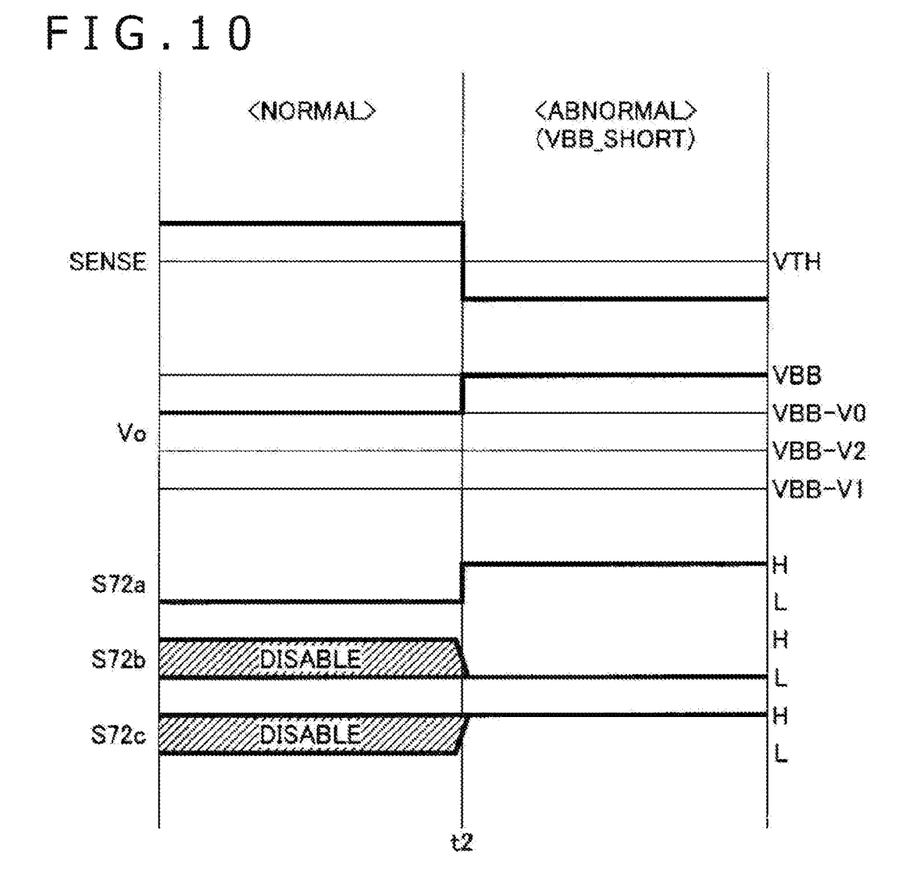
FIG. 10 is a diagram illustrating an example of a short-to-power-supply-voltage condition detection operation.

FIG. 10 is a diagram illustrating an example of a short-to-power-supply-voltage condition detection operation. FIG. 10 depicts, in order from its top side, the output current detection signal SENSE, the output voltage Vo, the output abnormality detection signal S72a, the turn-on resistance control signal S72b, and the determination signal S72c, just like in FIG. 9 described above.

Before time t2, the short-to-power-supply-voltage condition is not occurring at the external terminal T2 and the output current Io is appropriately flowing through the fully turned-on NMOSFET 10. Thus, the output current detection signal SENSE is higher than the threshold voltage VTH. Further, the output voltage Vo is equal to the voltage VBB−V0, which is lower than the power supply voltage VBB by the drain-source voltage V0 of the NMOSFET 10.

Further, before the time t2, the condition represented by SENSE>VTH is satisfied, and thus, the condition represented by S72=L (logical level when the output abnormality is not detected) is satisfied. Accordingly, each of the turn-on resistance control signal S72b and the determination signal S72c is in the disabled state (for example, the high impedance state). As described above, as a matter of course, the behavior before the time t2 is exactly the same as that before the time t1 in FIG. 9.

Upon occurrence of the short-to-power-supply-voltage condition at the external terminal T2 at the time t2, a situation in which almost no output current Io flows through the NMOSFET 10 (see FIG. 6 described above) arises. Thus, the output current detection signal SENSE becomes lower than the threshold voltage VTH.

At this time, the condition represented by S72a=H (logical level when the output abnormality is detected) is satisfied, and thus, the comparator 72b is brought to the enabled state. Accordingly, after the time t2, the turn-on resistance Ron of the NMOSFET 10 (involving the drain-source voltage Vds) is controlled according to the turn-on resistance control signal S72b.

In this regard, however, in the case in which the short-to-power-supply-voltage condition is occurring at the external terminal T2, the output voltage Vo does not depend on the turn-on resistance Ron of the NMOSFET 10 and is determined by external factors (refer to the resistance element Ry of the short-circuit path and the short-to-power-supply-voltage current Ivbbs in FIG. 6). Specifically, the output voltage Vo becomes substantially equal to the power supply voltage VBB. At this time, the turn-on resistance control signal S72b remains fixed to a low level (logical level when the turn-on resistance Ron is increased).

Further, upon satisfaction of the condition represented by S72a=H (logical level when the output abnormality is detected), the comparator 72c is also brought to an enabled state. Thus, after the time t2, the determination signal S72c according to the result of the comparison of the output voltage Vo with the second voltage VBB−V2 is output. According to FIG. 10, a condition represented by Vo (≈VBB)>VBB−V2 is satisfied, and thus, the determination signal S72c becomes a high level.

In this way, when conditions represented by S72a=H and S72c=H are satisfied, a determination that the short-to-power-supply-voltage condition is occurring at the external terminal T2 can be made.

Note that, if the NMOSFET 10 is in its turn-off period, the determination as to which of the load-open condition and the short-to-power-supply-voltage condition is occurring can be easily made on the basis of the output voltage Vo. However, when such a sequence is employed that, upon receipt of rising of the output abnormality detection signal S72a to the high level (logical level when the output abnormality is detected), the NMOSFET 10 is fully turned off and then the determination as to which of the load-open condition and the short-to-power-supply-voltage condition is occurring is started anew, it takes a long time (for example, several hundreds of µs) to obtain the result of the determination.

In contrast, employing the above-described output abnormality detection circuit 72 makes it possible to, after the detection of the output abnormal condition (S72a=H), promptly determine which of the load-open condition and the short-to-power-supply-voltage condition is occurring, without waiting for the completion of the full turn-off of the NMOSFET 10. Accordingly, the safety of an electronic device (in-vehicle device) in which the semiconductor integrated circuit device 1 is mounted can be enhanced.

In addition, the control logic section 40 is capable of reporting, to the ECU 2, a current condition determined from among conditions, namely, a normal condition, the short-to-ground condition, the load-open condition, and the short-to-power-supply-voltage condition, using, for example, a prepared output abnormality report signal FAIL including two bits indicating "00," "01," "10," and "11" corresponding to the respective conditions.

<Application to Vehicle>

Figure 11:
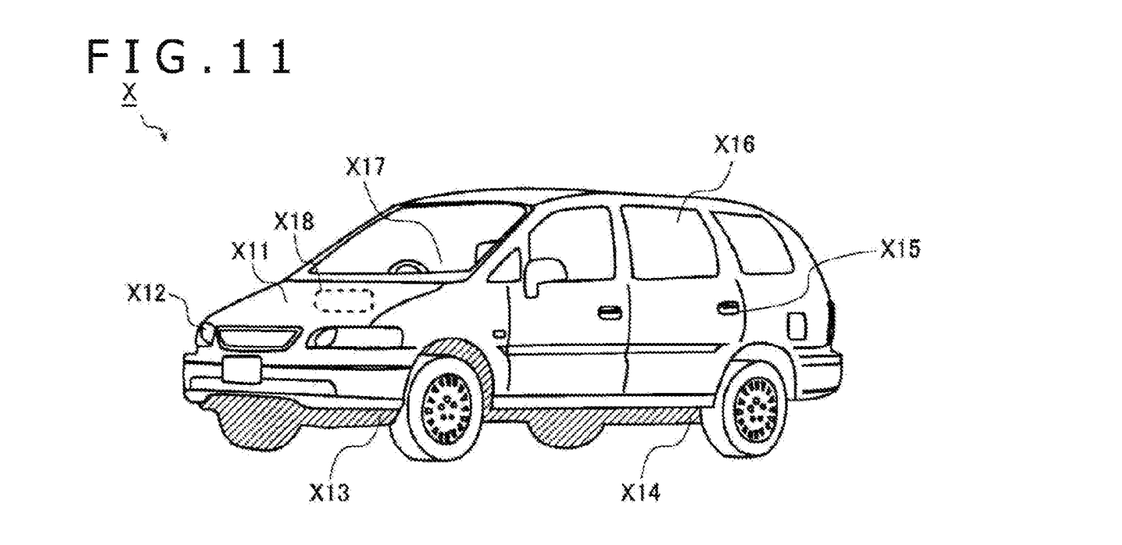
FIG. 11 is an external view of a vehicle illustrating a configuration example of the vehicle.

FIG. 11 is an external view of a vehicle illustrating a configuration example of the vehicle. A vehicle X in this configuration example mounts a battery (not illustrated in FIG. 11) and various kinds of electronic devices X11 to X18 that operate by receiving supply of electric power from the battery. Note that mounted positions of the electronic devices X11 to X18 in FIG. 11 may be different from actual positions for convenience of illustration.

The electronic device X11 is an engine control unit that performs various kinds of control in relation to an engine, such as injection control, electronic throttle control, idling control, oxygen sensor heater control, and auto cruise control.

The electronic device X12 is a lamp control unit that performs turn-on/off control of each of lamps, such as a high intensity discharged lamp (HID) and a daytime running lamp (DRL).

The electronic device X13 is a transmission control unit that performs control in relation to a transmission.

The electronic device X14 is a body control unit that performs various kinds of control in relation to travel of the vehicle X, such as anti-lock brake system (ABS) control, electric power steering (EPS) control, and electronic suspension control.

The electronic device X15 is a security control unit that performs drive control of each of a door lock, a burglar alarm, and the like.

The electronic device X16 is an electronic device that is mounted into the vehicle X as standard equipment or a manufacturer's option product at the stage of factory shipping, and examples of this electronic device X16 include, but are not limited to, a wiper, an electric door mirror, a power window, a damper (shock absorber), an electric sunroof, and an electric seat.

The electric device X17 is an electric device that is optionally mounted in the vehicle X as a user's option product, and examples of this electronic device X17 include, but are not limited to, in-vehicle audio/visual (A/V) equipment, a car navigation system, an electronic toll collection system (ETC).

The electronic device X18 is an electronic device including a high voltage tolerance motor, and examples of this electronic device X18 include, but are not limited to, an in-vehicle blower, an oil pump, a water pump, a battery cooling fan.

Note that the semiconductor integrated circuit device 1, the ECU 2, and the load 3, which have been described above, can be mounted in any one of the electronic devices X11 to X18.

<Other Modification Examples>

In the above embodiment, the in-vehicle high-side switch LSI has been described as an example, but application targets of the disclosure in the present specification is not limited to the in-vehicle high-side switch LSI, and the disclosure can widely be applied to high-side switch LSIs other than the in-vehicle high-side switch LSI.

Further, not only the above-described embodiment but also the various technical features disclosed in the present specification can be modified in various ways within the scope not departing from the gist of the technical creation thereof. That is, it should be considered that the above-described embodiment is just an example and is not restrictive in all respects. Further, the technical scope of the present disclosure is indicated not by the description of the above embodiment but by the claims, and is to be understood as including meanings equivalent to the claims, and all modifications belonging within the claims.

The disclosure in the present specification can be used in an in-vehicle IPD and the like.

What is claimed is:

1. A switch device, comprising:
   a switch element coupled between a power supply terminal and an output terminal; and
   an output abnormality detection circuit configured to:
      detect an occurrence of an output abnormal condition, wherein the detection is based on an output current flowing during a turn-on period of the switch element that is smaller than a threshold value;
      increase a turn-on resistance of the switch element to cause an output voltage at the output terminal to coincide with a first voltage;
      compare the output voltage with a second voltage higher than the first voltage; and
      determine that the output abnormal condition is one of a load-open condition or a short-to-power-supply-voltage condition at the output terminal based on a result of the comparison.

2. The switch device according to claim 1, wherein the output abnormality detection circuit is further configured to:

determine that the output abnormal condition is the load-open condition at the output terminal in a case where the output voltage is lower than the second voltage, and determine that the output abnormal condition is the short-to-power-supply-voltage condition at the output terminal in a case where the output voltage is higher than the second voltage.

3. The switch device according to claim 2, wherein the output abnormality detection circuit includes:
a first comparator configured to compare one of an output current detection signal according to the output current or a sense voltage according to the output current with a determined threshold voltage to generate an output abnormality detection signal;
a second comparator configured to compare the output voltage with the first voltage to generate a turn-on resistance control signal; and
a third comparator configured to compare the output voltage with the second voltage to generate a determination signal.

4. The switch device according to claim 3, wherein the second comparator and the third comparator are both enable-controlled according to the output abnormality detection signal.

5. The switch device according to claim 3, wherein the output abnormality detection circuit further includes:
a first resistor coupled between the power supply terminal and an application node of the first voltage;
a second resistor coupled between the power supply terminal and an application node of the second voltage;
a first current source coupled between the application node of the first voltage and a constant electric potential node; and
a second current source coupled between the application node of the second voltage and the constant electric potential node.

6. An electronic device, comprising:
a switch device that includes:
a switch element coupled between a power supply terminal and an output terminal; and
an output abnormality detection circuit configured to:
detect an occurrence of an output abnormal condition, wherein the detection is based on an output current flowing during a turn-on period of the switch element that is smaller than a threshold value;
increase a turn-on resistance of the switch element to cause an output voltage at the output terminal to coincide with a first voltage;
compare the output voltage with a second voltage higher than the first voltage; and
determine that the output abnormal condition is one of a load-open condition or a short-to-power-supply-voltage condition at the output terminal based on a result of the comparison; and
a load coupled to the switch device.

7. The electronic device according to claim 6, wherein the load is one of a valve lamp, a relay coil, a solenoid, a light emitting diode, or a motor.

8. A vehicle, comprising:
an electronic device that includes:
a switch device that includes:
a switch element coupled between a power supply terminal and an output terminal; and
an output abnormality detection circuit configured to:
detect an occurrence of an output abnormal condition, wherein the detection is based on an output current flowing during a turn-on period of the switch element that is smaller than a threshold value;
increase a turn-on resistance of the switch element to cause an output voltage at the output terminal to coincide with a first voltage;
compare the output voltage with a second voltage higher than the first voltage; and
determine that the output abnormal condition is one of a load-open condition or a short-to-power-supply-voltage condition at the output terminal based on a result of the comparison; and
a load coupled to the switch device.

9. A switch device, comprising:
a switch element coupled between a power supply terminal and an output terminal; and
an output abnormality detection circuit that comprises:
a first comparator configured to compare one of an output current detection signal or a sense voltage with a threshold value to output an output abnormality detection signal, wherein each of the output current detection signal and the sense voltage are based on an output current at the output terminal;
a second comparator configured to compare an output voltage at the output terminal with a first voltage to output a turn-on resistance control signal; and
a third comparator configured to compare the output voltage with a second voltage, higher than the first voltage, to output a determination signal, wherein the output abnormality detection circuit is configured to:
detect an occurrence of an output abnormal condition based on the output abnormality detection signal, wherein the detection is based on the output current flowing during a turn-on period of the switch element;
increase a turn-on resistance of the switch element based on the turn-on resistance control signal so as to cause the output voltage at the output terminal to coincide with the first voltage;
determine, based on the determination signal, that the output abnormal condition is a load-open condition at the output terminal in a case where the output voltage is lower than the second voltage; and
determine, based on the determination signal, that the output abnormal condition is a short-to-power-supply-voltage condition at the output terminal in a case where the output voltage is higher than the second voltage.

\* \* \* \* \*